United States Patent
Cohen et al.

(10) Patent No.: US 10,902,620 B1
(45) Date of Patent: Jan. 26, 2021

(54) REGISTRATION BETWEEN AN IMAGE OF AN OBJECT AND A DESCRIPTION

(71) Applicant: Applied Materials Israel Ltd., Rehovot (IL)

(72) Inventors: Shaul Cohen, Irus (IL); Amit Batikoff, Petach Tikva (IL); Lavi Jacov Shachar, Tel Aviv (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 0 days.

(21) Appl. No.: 16/388,416

(22) Filed: Apr. 18, 2019

(51) Int. Cl.
| | | |
|---|---|---|
| *G06T 15/00* | (2011.01) | |
| *G06T 7/33* | (2017.01) | |
| *G06T 7/32* | (2017.01) | |
| *G06T 3/40* | (2006.01) | |
| *G06T 7/73* | (2017.01) | |
| *G06T 17/20* | (2006.01) | |
| *G06T 3/00* | (2006.01) | |
| *G06F 30/00* | (2020.01) | |

(52) U.S. Cl.
CPC ............. *G06T 7/33* (2017.01); *G06T 3/0068* (2013.01); *G06T 3/4053* (2013.01); *G06T 7/32* (2017.01); *G06T 7/73* (2017.01); *G06T 17/20* (2013.01); *G06F 30/00* (2020.01)

(58) Field of Classification Search
CPC . G06T 2207/30148; G06T 7/001; G06T 7/33; G06T 2207/10061; G06K 9/00536
USPC ......................................................... 345/418
See application file for complete search history.

(56) References Cited

U.S. PATENT DOCUMENTS

| | | | |
|---|---|---|---|
| 8,855,399 B2 | 10/2014 | Goren et al. | |
| 8,977,035 B2 * | 3/2015 | Dalla-Torre | G06T 7/001 |
| | | | 382/149 |
| 9,013,571 B2 * | 4/2015 | Abe | G06T 7/187 |
| | | | 348/79 |
| 9,098,893 B2 * | 8/2015 | Dalla-Torre | G06T 7/001 |
| 9,141,879 B2 * | 9/2015 | Ushiba | G01B 15/00 |
| 9,881,365 B2 * | 1/2018 | Tandai | G06K 9/6268 |
| 10,318,805 B2 * | 6/2019 | Nakayama | G06K 9/00536 |

(Continued)

OTHER PUBLICATIONS

Lucas, B.D. et al. (1981). "An Iterative Image Registration Technique with an Application to Stereo Vision", Proceedings of Imaging Understanding Workshop, pp. 121-130.

(Continued)

*Primary Examiner* — Phu K Nguyen
(74) *Attorney, Agent, or Firm* — Lowenstein Sandler LLP

(57) ABSTRACT

An apparatus, method and non-transitory computer readable storage medium for registering between an image and a description of a multi-layer object, the apparatus comprising: a memory for storing an image of the object and at least part of the description, the part comprising a first description of a first layer and a second description of a second layer of the object; and a processor operatively connected to the memory for: matching the first description to a first part of the image, the first part informative of a part of the first layer, thereby determining a first matching offset; matching the second description to a second part of the image, the second part informative of a part of the second layer, thereby determining a second matching offset; and registering between the image and the description of the multi-layer object based on the at least on the first and second matching offsets.

19 Claims, 5 Drawing Sheets

(56) References Cited

U.S. PATENT DOCUMENTS

| | | | |
|---|---|---|---|
| 10,352,875 B2* | 7/2019 | Fukazawa | G01N 21/9501 |
| 10,475,179 B1* | 11/2019 | Bishop | G01R 31/308 |
| 10,529,068 B2* | 1/2020 | Sakai | G06T 7/0004 |
| 2006/0045326 A1 | 3/2006 | Toyoda et al. | |
| 2010/0296722 A1 | 11/2010 | Liu et al. | |
| 2012/0257039 A1 | 10/2012 | Abe | |
| 2013/0163851 A1 | 6/2013 | Dalla-Torre et al. | |
| 2013/0216141 A1 | 8/2013 | Ushiba et al. | |
| 2013/0278748 A1 | 10/2013 | Nakayama et al. | |
| 2013/0336575 A1 | 12/2013 | Dalla-Torre et al. | |

OTHER PUBLICATIONS

Bruhn, A. et al. (2005). "Combining Local and Global Optic Flow Methods". International Journal of Computer Vision 61(3), 211-231.

* cited by examiner

REGISTRATION BETWEEN AN IMAGE OF AN OBJECT AND A DESCRIPTION

TECHNICAL FIELD

The presently disclosed subject matter relates to examining objects, and more particularly to registration of an image of an object with design data of the object.

BACKGROUND

Typically, an image of a fabricated object is obtained as a part of the examination processes, and is usable for a plurality of tests, including taking measurements (e.g. such as measurements of the width or length of a line or an area, gaps between features, or the like) and comparing them to required values. The features to be measured or other tests to be performed can be obtained from user input, and the required dimensions can be obtained from any description of the object.

In order to perform such measurements, the image of the fabricated object has to be registered with the description.

The term "object" used in this specification should be expansively construed to cover any kind or specimen of wafers, masks, reticle and other structures, combinations and/or parts thereof used for manufacturing semiconductor integrated circuits, magnetic heads, flat panel displays, and other semiconductor-fabricated articles. Various objects such as semiconductor wafers, printed circuit boards, solar panels, microelectromechanical devices are fabricated by manufacturing processes that are highly complex and expensive, comprise multiple stages and require very accurate machines.

Unless specifically stated otherwise, the term "examination" used in this specification should be expansively construed to cover any kind of detection and/or classification of defects in an object. Examination is provided by using non-destructive inspection tools during or after manufacture of the object to be examined. By way of non-limiting example, the examination process can include runtime scanning (in a single or in multiple scans), sampling, reviewing, measuring, classifying and/or other operations provided with regard to the object or parts thereof using the same or different inspection tools. Likewise, examination can be provided prior to manufacture of the object to be examined and can include, for example, generating an examination recipe(s). It is noted that, unless specifically stated otherwise, the term "examination" or its derivatives used in this specification are not limited with respect to resolution or size of inspection area. A variety of non-destructive inspection tools includes, by way of non-limiting example, scanning electron microscopes, atomic force microscopes, optical inspection tools, etc.

Unless specifically stated otherwise, the term "image" used in the specification should be expansively construed to cover any non-destructive capturing of an object, including but not limited to capturing by an optical device, capturing by a scanning electron microscope, or by any other device. The term may also relate to a combination of two or more scanned images taken from one or more perspectives or by one or more capture devices, processed captured images, or the like.

Unless specifically stated otherwise, the term "description" used in the specification should be expansively construed to cover any description or data indicative of hierarchical physical design (layout) of an object, e.g., design data of in the form of layers. The description can be provided by a respective designer and/or can be derived from the physical design (e.g. through simulation, geometric and Boolean operations, etc.). The description can be provided in different formats such as, by way of non-limiting examples, one or more captured or synthesized images, GDSII format, OASIS format, etc. The description can be presented in vector format, grayscale intensity image format or otherwise. The description can comprise design structural elements that represent different features to be formed on one or more layers of a specimen. One or more layers can comprise one or more lines or areas to be placed as part of an object fabricated in accordance with the design, such that the object is manufactured layer-wise in accordance with the ordered layers. The description can also be provided in other formats such as, by way of non-limiting examples, one or more captured images of a reference object or a part thereof manufactured in accordance with a design of the object to be examined, whether the part comprises one or more horizontal layers of the reference object or a piece of the reference object. The description can also be provided as one or more synthesized images, created upon the description of an object, such as Computer Aided Design of an object or a part thereof.

Unless specifically stated otherwise, the term "registration" used in the specification should be expansively construed to cover any matching between an image and a representation, intended to determine how the image should be altered, for example moved or deformed to correspond to the description, vice versa, or a combination thereof. Registration can utilize search of features appearing in the image or in the description within the other.

GENERAL DESCRIPTION

In accordance with certain aspect of the presently disclosed subject matter, there is provided an apparatus for registering between an image of a multi-layer object and a description of the multi-layer object, the apparatus comprising: a memory for storing an image of the multi-layer object and at least part of the description of the multi-layer object, the part comprising a first description of one or more first layers and a second description of one or more second layers of at least two layers of the multi-layer object; and a processor operatively connected to the memory for: matching the first description to at least a first part of the image, the first part informative of at least a part of the first layer, thereby determining one or more first matching offsets; matching the second description to at least a second part of the image, the second part informative of at least a part of the second layer, thereby determining one or more second matching offsets; and registering between the image of the multi-layer object and the description of the multi-layer object based on the first matching offsets and the second matching offsets. The description of the multi-layer object can be, for example, a Computer Aided Design (CAD) of the multi-layer object. In accordance with further aspects of the presently disclosed subject matter, the description of a given layer can be an image selected from one or more of an image presenting the given layer of a reference object, and a synthetic image presenting the given layer and synthesized upon the design of the multi-layer object. The synthetic image can be, for example, an image comprising one or more layers that have not been captured by an examination tool. In accordance with further aspects of the presently disclosed subject matter, the first part of the image and the second part of the image can at least partially overlap, wherein to match the first description to the first part of the image, the processor can further determine first pixels of the image in which a first feature from the first description of the first layer is found, and to match the second description to the second part of the image, the processor can further mask the first pixels in the first part of the image. In accordance with some aspects of the presently disclosed subject matter, masking can comprise one of assigning a neutral value to the first pixels and ignoring the first pixels. The processor can further: match a description of each further layer of the multi-layer object with at least a part of the image informative of at least a part of the further layer to determine at least one further matching offset; and register between the image of the multi-layer object and the description of the multi-layer object based on the first matching offsets, the second matching offsets and the one or more further matching offsets. The processor can further combine the first matching offsets and the second matching offsets into a single offset usable for registration. The processor can further notify a user that the first matching offsets and the second matching offsets cannot be combined into a single offset usable for registration. In accordance with some aspects of the presently disclosed subject matter, registration can include determining the location of one or more features from the description within the image.

In accordance with another aspect of the presently disclosed subject matter, there is provided a method for registering between an image of a multi-layer object and a description of the multi-layer object, the method comprising: receiving the image of the multi-layer object and at least part of the description of the multi-layer object, the part comprising a first description of at least a first layer of two or more layers of the multi-layer object and a second description of at least a second layer of the multi-layer object; matching, by a processor, the first description to at least a first part of the image, to determine one or more first matching offsets, wherein the first part is informative of at least a part of the first layer; matching, by the processor, the second description to at least a second part of the image to determine one or more second matching offsets between the second description of the second layer and the second part of the image, wherein the second part is informative of at least a part of the second layer; and registering between the image of the multi-layer object and the description of the multi-layer object based on the first matching offsets and the second matching offsets. In accordance with further aspects of the presently disclosed subject matter, the description of the multi-layer object can be a Computer Aided Design (CAD) of the multi-layer object. The method can further comprise combining the first matching offsets and the second matching offsets into a single matching offset usable for registration. In accordance with further aspects of the presently disclosed subject matter, the description of a given layer can be a visual representation selected from: an image presenting the given layer of a reference object; and a synthetic image synthesized upon the design of the multi-layer object. In accordance with further aspects of the presently disclosed subject matter, the first part of the image and the second part of the image can at least partially overlap, matching the first description to the first part of the image can comprise determining first pixels in the first part of the image in which a first feature from the first description of the first layer is found, and matching the second description to the second part of the image can comprise masking the first pixels in the first part of the image. In accordance with further aspects of the presently disclosed subject matter, masking can comprise one of assigning a neutral value to the first pixels, and ignoring the first pixels. In accordance with further aspects of the presently disclosed subject matter, the at least part of the description can comprise a further description of a further layer of the multi-layer object, the method can further comprise: matching by the processor the further description to at least a part of the image informative of at least a part of the further layer, thereby determining one or more further matching offsets; and registering between the image of the multi-layer object and the description of the multi-layer object based on the first matching offsets, the second matching offsets and the further matching offsets. In accordance with further aspects of the presently disclosed subject matter, matching the further description can comprise: determining first pixels in the first part of the image in which a first feature from the first description is found; determining second pixels in the second part of the image in which a second feature from the second description is found; and masking the first pixels and second pixels. In accordance with further aspects of the presently disclosed subject matter, the feature can be a polygon, and subject to the polygon being an open polygon, the polygon can be closed by edges of the captured image. The method can further comprise determining a layer order for matching the multi-layer object, by executing trial positioning at different layer orders and selecting a layer order that provides highest cost-effective results.

In accordance with another aspect of the presently disclosed subject matter, there is provided a non-transitory computer readable storage medium comprising instructions, which when executed by a processor, cause the processor to perform operations comprising: receiving the image of the multi-layer object and at least part of the description of the multi-layer object, the part comprising a first description of at least a first layer of two or more layers of the multi-layer object and a second description of at least a second layer of the multi-layer object; matching, by a processor, the first description to at least a first part of the image, to determine one or more first matching offsets, wherein the first part is informative of at least a part of the first layer; matching, by the processor, the second description to at least a second part of the image to determine one or more second matching offsets between the second description of the second layer and the second part of the image, wherein the second part is informative of at least a part of the second layer; and registering between the image of the multi-layer object and the description of the multi-layer object based on the first matching offsets and the second matching offsets.

BRIEF DESCRIPTION OF THE DRAWINGS

In order to understand the invention and to see how it can be carried out in practice, embodiments will be described, by way of non-limiting examples, with reference to the accompanying drawings, in which.

DETAILED DESCRIPTION

Figure 1:
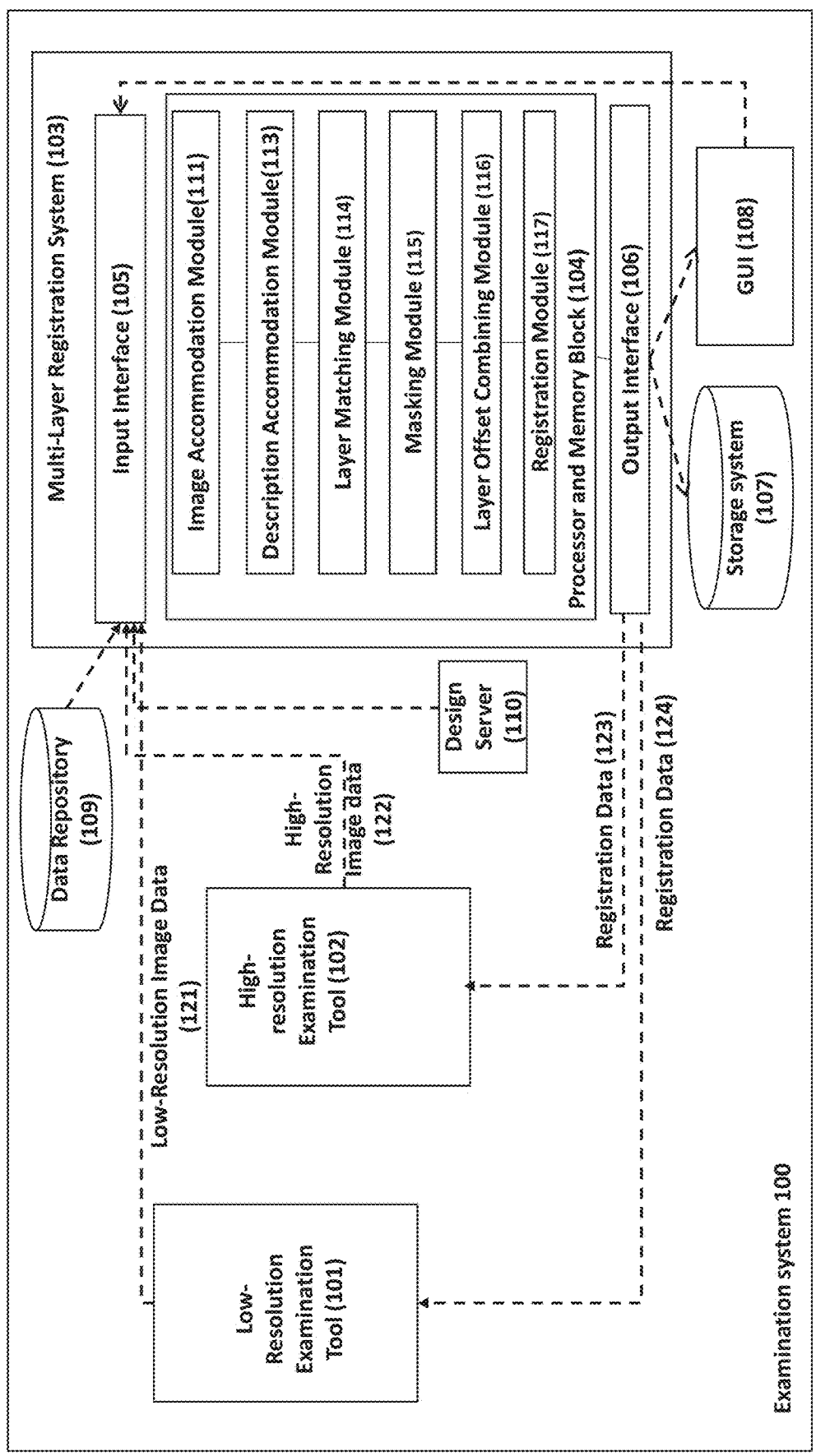
FIG. 1 illustrates a generalized block diagram of an examination system configured in accordance with some exemplary embodiments of the disclosure.

In the following detailed description, numerous specific details are set forth in order to provide a thorough understanding of the invention. However, it will be understood by those skilled in the art that the presently disclosed subject matter can be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "determining", "processing", "computing", "representing", "comparing", "generating", "assessing", "updating" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities, including disclosed herein apparatus and processor thereof.

The operations in accordance with the teachings herein can be performed by a computer specially constructed for the desired purposes or by a general-purpose computer specially configured for the desired purpose by a computer program stored in a non-transitory computer-readable storage medium.

The terms "non-transitory memory" and "non-transitory storage medium" as used herein should be expansively construed to cover any include any volatile or non-volatile computer memory suitable to the presently disclosed subject matter.

The term "masking" as used herein should be expansively construed to cover any manner of disregarding one or more pixels of an image during registration between an image of an object and a description thereof, or during matching of one or more layer descriptions with the image. In one embodiment, the pixels can be assigned a neutral value, wherein the values of the masked pixels do not affect the result obtained upon the rest of the pixels. For example, if registration or further matching includes performing addition operations, a value of 0 can be used, while for multiplication operations a value of 1 can be used. In other embodiments, the pixels to be masked can remain unchanged, or set to any arbitrary value or values but the computation may skip considering these pixels and consider only non-masked pixels. It will be appreciated that masking can take other forms as well, depending on the specific implementation used.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Registration between an image and a description presents multiple difficulties and problems, such as element mismatch, inability to identify certain elements at all or at an expected location, size mismatch, color or shade mismatch, or the like. The problems may be caused by manufacturing problems, including process errors and inaccuracies, problems with the used materials, undesired movements of the object or the equipment used during manufacturing, or other problems occurring during manufacturing. Additionally or alternatively, problems may occur during capturing the object, such as but not limited to optical or mechanical problems, thus disabling or damaging registration.

Such registration problems have been recognized in the conventional art and various techniques have been developed to provide solutions.

Reference is now made to FIG. 1 illustrating a functional block diagram of an examination system in accordance with certain embodiments of the presently disclosed subject matter. The examination system 100 illustrated in FIG. 1 can be used for examination of an object for defects. The examination can be a part of the object fabrication and can be provided during manufacturing the object or afterwards. The illustrated examination system 100 includes computer-based system 103 capable of automatic registration between an image of a fabricated object and a description. The system 103 is referred to hereinafter as an MLR (multi-layer registration) system. MLR system 103 can be operatively connected to one or more low-resolution examination tools 101 and/or one or more high-resolution examination tools 102. The examination tools are configured to capture inspection images and/or to review the captured inspection image(s) and/or to enable or provide measurements related to the captured image(s). MLR system 103 can be further operatively connected to additional data sources such as design server 110 or data repository 109.

MLR system 103 includes a processor and memory block (PMB) 104 operatively connected to a hardware-based input interface 105 and to a hardware-based output interface 106. PMB 104 is configured to provide all processing necessary for operating MLR system 103 and is further detailed with reference to FIGS. 2-4 below. PMB 104 includes a processor (not shown separately) and a memory (not shown separately). The processor of PMB 104 can be configured to execute several functional modules in accordance with computer-readable instructions implemented on a non-transitory computer-readable memory comprised in PMB 104. Such functional modules are referred to hereinafter as included in PMB 104. The functional modules in the PMB 104 include or are operatively connected to: image accommodation module 111 configured to store in memory an image of a multi-layer object taken after one or more layers have been deposited, description accommodation module 112 configured to store in memory a description of a multi-layer object where the description is related to one or more of the layers, layer matching module 114 configured to match the image with a description of a layer or features thereof received from design server 110 and obtain a layer matching offset, masking module 115 configured to mask one or more pixels in the image prior to matching with the description of another layer, offset combining module 116 for combining two or more layer matching offsets, and registration module 117 configured to form a registration between the image and the description, using the matching offsets determined for various layers. The operation of MLR system 103, PMB 104 and the functional blocks therein is further detailed with reference to FIGS. 2-4.

As will be further detailed with reference to FIGS. 2-4, MLR system 103 is configured to receive, via input interface 105, data (and/or derivatives thereof) produced by the examination tools and/or data stored in one or more data repositories 109 and/or in design server 110 and/or another relevant data depository. MLR system 103 is further configured to process the received data and send, via output interface 106, results to a storage system 107, to examination tool(s), to a computer-based graphical user interface (GUI) 108 for rendering the results and/or to external systems. GUI 108 can be further configured to enable user-specified inputs related to operating MLR system 103.

As an example, an object can be examined by a low-resolution examination tool 101, e.g. an inspection system such as the Elite or the UVision systems by Applied Materials, Inc., or other tools. The resulting data, referred to hereinafter as low-resolution image data 121, being informative of the low-resolution images (and/or derivatives thereof) can be transmitted, directly or via one or more intermediate systems, to MLR system 103. Alternatively or additionally, the object can be examined by a high-resolution examination tool 102 (e.g. a subset of potential defects selected for review can be reviewed by a scanning electron microscope (SEM) or Atomic Force Microscopy (AFM)). The resulting data, referred to hereinafter as high-resolution image data 122, informative of high-resolution images and/or derivatives thereof can be transmitted, directly or via one or more intermediate systems, to MLR system 103.

Upon possibly registering between the image data captured by low resolution examination tool 101 or by high resolution examination tool 102 and possibly processed, with a description of one or more layers, MLR system 103 can send the results (e.g. registration data 123 and/or 124) to any of the examination tool(s), store the results such as registration offset in storage system 107, render an image modified in accordance with the results via GUI 108 and/or send to an external system.

Those versed in the art will readily appreciate that the teachings of the presently disclosed subject matter are not bound by the system illustrated in FIG. 1, equivalent and/or modified functionality can be consolidated or divided in another manner and can be implemented in any appropriate combination of software with firmware and hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in another embodiment at least part of examination tools 101 and/or 102, data repository 109, storage system 107 and/or GUI 108 can be external to the examination system 100 and operate in data communication with MLR system 103 via input interface 105 and output interface 106. MLR system 103 can be implemented as stand-alone computer(s) to be used in conjunction with the examination tools. Alternatively, the respective functions of MLR system 103 can, at least partly, be integrated with one or more examination tools.

Without limiting the scope of the disclosure in any way, it should also be noted that the examination tools can be implemented as inspection machines of various types, such as optical imaging machines, electron beam inspection machines and so on. In some cases the examination tools can be configured to examine an entire object (e.g. an entire wafer or at least an entire die) for detection of potential defects. In other cases, at least one examination tool can be a review tool, which is typically of higher resolution and which is used for ascertaining whether a potential defect is indeed a defect. Such a review tool is usually configured to inspect fragments of a die, one at a time, in higher resolution.

Figure 2A:
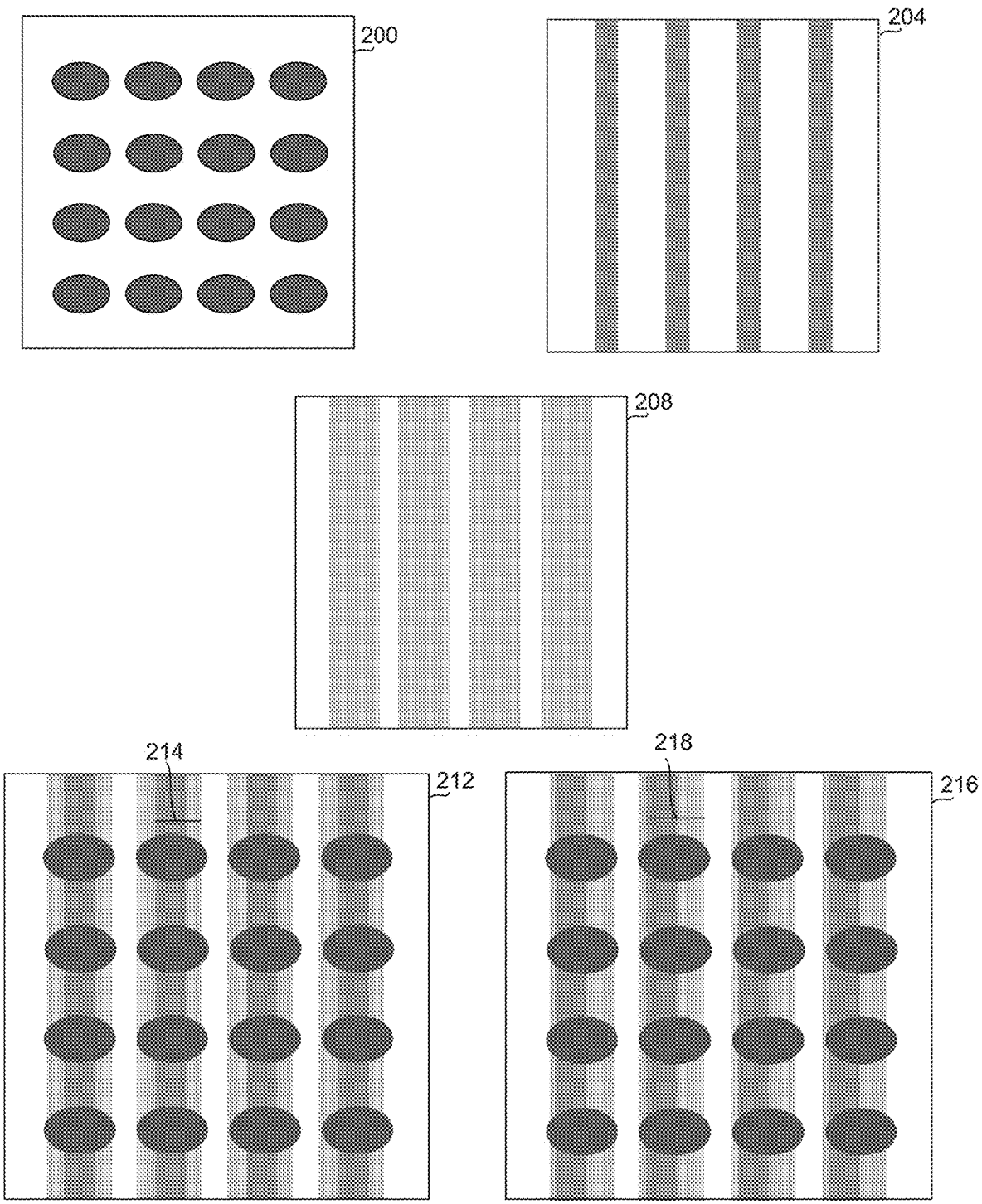
FIGS. 2A and 2B illustrate an example of the problem of registering a description with an image of a multi-layered object.
Figure 2B:
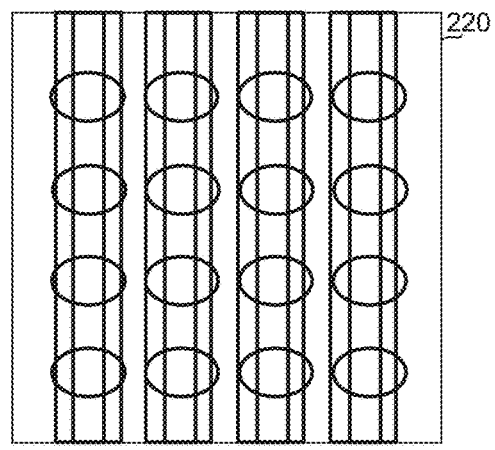
Figure 2B:
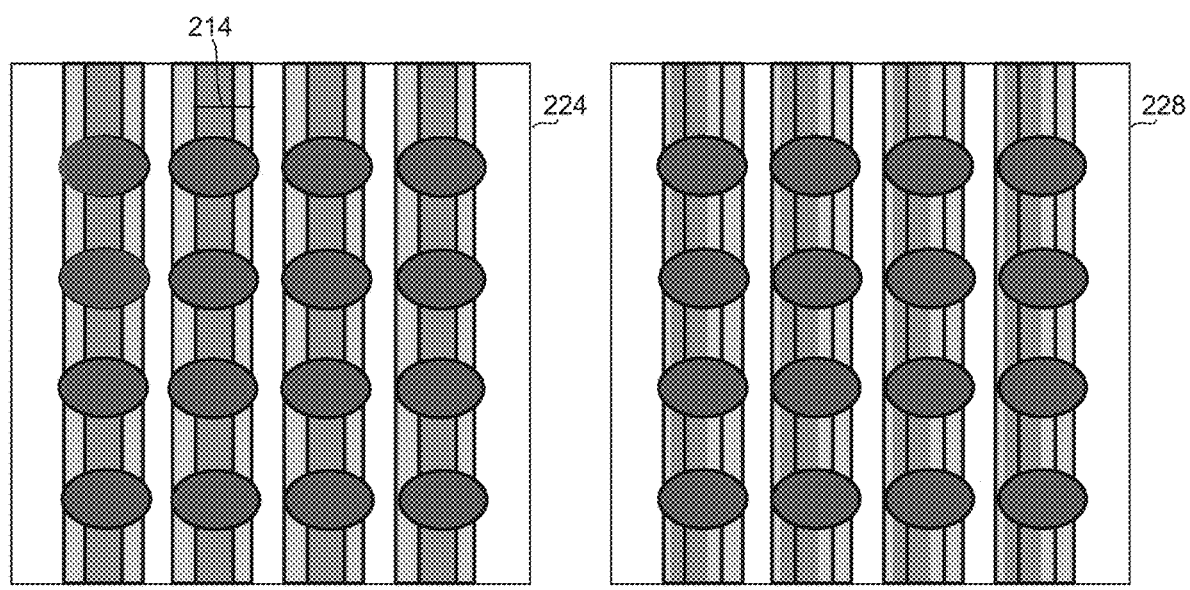

Referring now to FIGS. 2A and 2B, illustrating an example of the problem of registration a multi-layer design with an image.

FIG. 2A illustrates three exemplary layers of an object, such that each of the three layers includes a description of shapes to be placed in a layer of an object to be fabricated during the fabrication process: layer 1 (200) including ellipses, layer 2 (204) comprising thin stripes, and layer 3 (208) comprising thick stripes. The layers are to be processed such that layer 3 (208) is placed first, layer 2 (204) is placed on top of it, and layer 1 (200) is to be placed on top of layer 2 (204). The layers are obtained from any description, such as design data, captured image, synthesized image, or the like.

Image 212 shows an image of an object fabricated in accordance with the design when the three layers are placed as required relatively to each other, and an example of a measurement 214 to be taken on the object and compared to the value as required, for example by the design.

Image 216, however, shows an object fabricated in accordance with the design where an overlay problem exists and the three layers are not aligned as required relatively to each other but rather with a shift. In image 216 the thin stripes layer is shifted to the left relatively to the other layers, and thus measurement 218 differs from the required value of measurement 214. It will be appreciated that in other examples, due to shifts of one or more layers in one or more dimensions, some measurements are not at all possible since the required features cannot be located. For example, if the thin stripes of layer 204 are shifted such that they align with the right side of the wide stripes of layer 208, the feature indicated by measurement 214 cannot be identified at all.

Referring now to FIG. 2B, demonstrating how traditional registration fails in such cases. Pane 220 shows the outline of the features, including the perimeters of the features shown in layers 200, 204 and 208 of FIG. 2A. It will be appreciated that traditionally registration can utilize the outline of features obtained from the description, such as CAD features, to be registered with the image as appearing in outline 220. Alternatively, traditional registration can be performed using a synthetic image generated upon CAD data, as compared to the actual captured image. A synthetic image is an image comprising at least one layer that has not been captured by an examination tool. A synthetic image can be created by simulating the visual effect of each layer, and the visual interactions between layers such as hiding, shading, or the like.

Image 224 shows image 212 with the features of pane 220 as detected on image 212 of FIG. 2A, thus providing for a successful registration, and measurement 214 which can be easily taken. The term "successful registration" may relate to a situation in which the features obtained from the description, such as the CAD features, are found within the image and can be matched to specific locations within the image.

Image 228 shows image 216 of FIG. 2A in which the layers are shifted, is unsuccessfully registered with the outlines shown in pane 220, since the features cannot be found in the image, such that any measurement corresponding to measurement 214 will fail or produce a wrong result.

Figure 3:
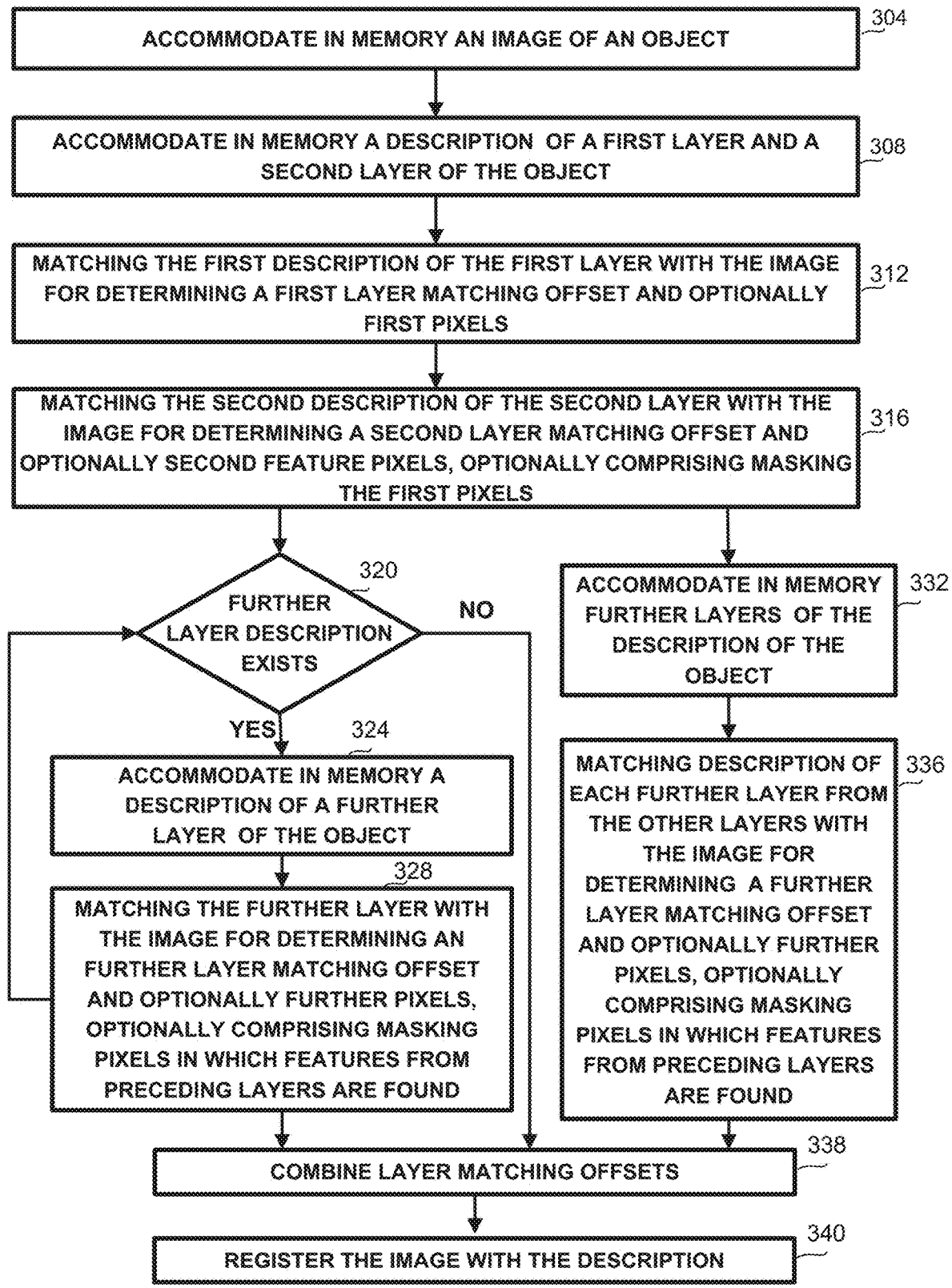
FIG. 3 illustrates a generalized flowchart of registering between a design of a multi-layer object with an image of an object, in accordance with some exemplary embodiments of the disclosure.
Figure 4:
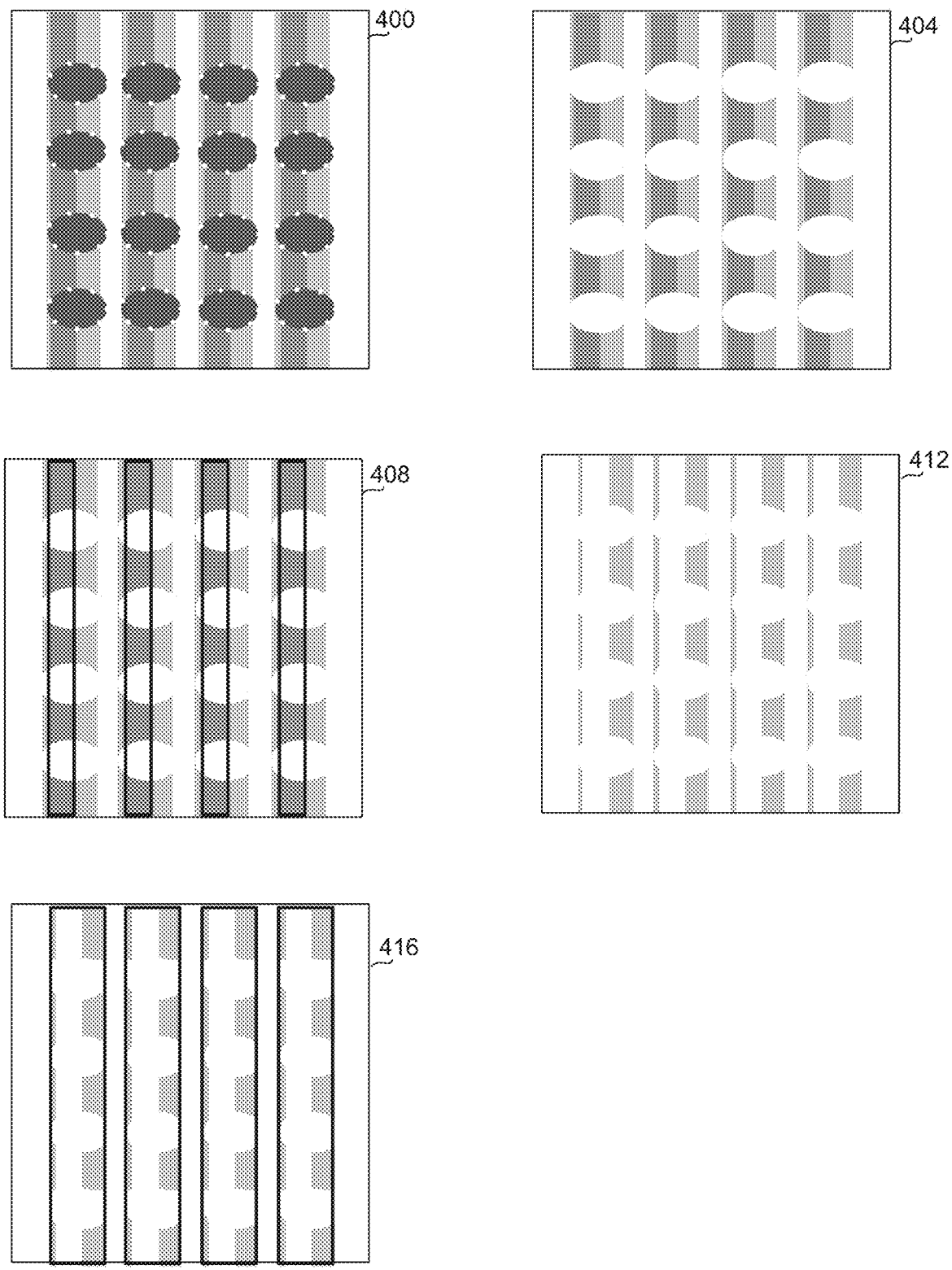
FIG. 4 illustrates an example of registering a multi-layer design with an image of an object, in accordance with some exemplary embodiments of the disclosure.

Referring now to FIG. 3, showing a generalized flowchart of registering a multi-layer design with an image of an object, and to FIG. 4, showing an example of registration between an image of an object and a multi-layer design of the same, in accordance with some exemplary embodiments of the disclosure.

Image accommodation module 111 can accommodate (304) in memory 104 an image of a fabricated multi-layer object, for example an image received by input interface 105 from a capture device such as low resolution examination tool 101 or high resolution examination tool 102.

Description accommodation module 113 of FIG. 1 can accommodate (308) in memory 104 at least a part of a description of a multi-layer object, comprising at least a first description of at least a first layer and a second description of a second layer of the multi-layer object, such as CAD layers of the captured object. It will be appreciated that the first description and the second description may be accommodated at the same or at separate times or locations, and optionally together with other layer descriptions of the design.

Layer matching module 114 can match (312) the first description of the first layer and at least a part of the image, for determining first pixels in which the features of the first description appear, and a first layer matching offset between the image and the first description of the first layer. Matching can be performed using one or more methods such as but not limited to correlation, normalized correlation, Critical Power Correlation (CPR), or the like, or tools similar to registration, for example edge detection, pattern matching, or the like.

Matching 312 is demonstrated on pane 400 in which the ellipses of description 200 are matched on the shifted layers of image 216, as indicated by the dotted lines enclosing the ellipses.

In some embodiments, matching at least a part of an image and a description of a layer can take into consideration all features of the layer, and match them against features found in an image. In other embodiments, matching can be performed in parts, upon one or more specific features. Specifically, matching can be performed by matching polygons in the layer design to polygons detected in the image. An open polygon can be completed into a closed polygon by one or more of the layer edges.

Thus, in such embodiments, a feature matching offset can be determined for each feature such as polygon or a group of polygons in a layer. Local computations, such as measuring distances between features in the image can be calculated by taking into account the offset of the polygon or polygons containing or close to the distance to be measured in each layer, rather than the layer matching offset.

If required, a layer matching offset can be calculated based upon the various feature matching offsets associated with polygons in the layer. For example, the layer matching offset can be calculated as the average of the matching offsets for the polygons comprised in the layer, as a weighted average of the polygon offsets taking into account the area of each polygon, or the like.

Calculating feature matching offsets can provide for higher accuracy in measuring distances, however, the computation can be more time and resource consuming.

In some embodiments, the image can be segmented, such that each pixel in the image can be assigned to a segment according to the layer it is recognized in and optionally according to the polygon or another shape it is contained in.

In some embodiments, one or more layers can be registered line by line rather than as a whole or polygon-wise. Feature matching offset can then be determined in accordance with the offset of each edge of the polygon.

Analogously to the above, layer matching module 114 can match (316) the description of the second layer and the image, for determining second pixels in which the features of the second description appear, and a second layer matching offset between the image and the second description of the second layer.

Matching (316) the second description of the second layer of the multi-layer object can comprise masking the image at the first pixels.

Masking is demonstrated on pane 404, in which the ellipses of description 200 are masked.

Masking can take a number of forms, which can take place as part of or after matching.

For example, if the second matching is performed by correlation, the first pixels can be ignored during matching. If the second matching is performed by normalized correlation, the matching formula can be normalized.

Thus, if masking is to be performed, then in some embodiments, the first pixels can be changed on the image as stored. In other embodiments, a copy of the image can be stored in which the pixel values are changed. In further alternatives, the relevant pixels can have special indication, or an external data structure comprising the pixel locations to be disregarded can be maintained.

It will be appreciated that matching with missing pixels, i.e., pixels that have been masked, can require virtual completion of features. For example, a line to be detected can have one or more missing parts, and whether the line is detected can have to be determined based on the remaining parts, which can require additional geometrical considerations, such as continuity of a piecewise line, uniqueness of a feature, or the like. However, if missing segments constitute a large part of a feature, the feature can be erroneously detected in other locations. Such considerations can be taken when determining the order at which layers are to be matched, as described below.

It will be appreciated that each layer can be matched using a different method and it is not required that features of all layers are detected by the same method. Further, while some layers can be matched as a whole, while other layers can be polygon-wise matched or line-wise matched.

Matching of the second description of the second layer with the image of the multi-layer object, following the masking, is demonstrated in pane 408, on which the thin stripes of description 204 are indicated.

It will be appreciated that in the example of FIG. 4, the second layer matching offset, between layer 204 and image 416 is different from the first layer matching offset, due to the shift of layer 204 relatively to layer 200.

It will be appreciated that masking can be performed by replacing the relevant pixel values in the image with a neutral value that does not affect the matching of the next layer, by copying the image to a new location and changing the pixel values thereon, by indicating the pixel locations, for example storing the pixel locations in a data structure to be considered in further matching, or in any other manner. A second matching offset can be indicated between the second layer and the image.

If it is determined (320) that no layer exists further to previously matched layers, offset combining module 116 can be operative in combining the layer matching offsets (338) and registration module 117 can perform registration (340) using the first and second and optionally further layer matching offsets, possible as combined. If another layer exists, then description accommodation module 113 can accommodate (324) the layer in memory 104 as described above, layer matching module can match (328) the layer with the image, optionally comprising masking the pixels in which features from any of the preceding layers has been detected.

A second masking is shown in pane 412 in which the thin stripes are masked, and further matching is shown in pane 416 in which the thick stripes of description 208 are matched on image 400, in which both the ellipses of description 204 and the thick stripes of description 208 are masked.

It will be appreciated that in the example of FIG. 4, the third matching offset, between layer 208 and image 416 is substantially equal to the first matching offset, and differs from the second matching offset. It will be appreciated that the first and third matching offsets being equal is for demonstration purposes only.

Description accommodation module (113) and layer matching module (114) can continue to accommodate (324) and match (328) further layers and determining further matching offset values until no more unmatched layers exist.

Alternatively, Description accommodation module 113 can be operative in accommodating in memory 104 descriptions of all other layers that have not previously been matched. In a further alternative, description accommodation module 113 can initially accommodate (308) in memory all description layers of the design, together with descriptions of the first and the second layers.

Layer matching module 114 can then match (336) the image with the description of each layer, with the image as masked by masking module 115, subject to matching all preceding layers.

Offset combining module 116 can then combine (338) the two or more layer matching offsets into a single offset value, if such combination is feasible and useful. For example, if the difference between the values does not exceed a predetermined threshold in either direction, the values may be combined, for example averaged on each direction. If the values are too far apart it may be determined that such combining is impossible.

Registration module 117 can then register (340), the image and the description, based on the first matching offset, the second matching offset and optionally further matching offsets, or on the combined offset. Registration cam relate to determining the location of one or more features from the description within the image.

In some embodiments, a report can be provided to a user comprising for example whether registration was successful, whether and how the layer matching offsets differ and the manufacturing process needs correction, or the process is satisfactory. The offsets or differences therebetween can also be reported.

In further embodiments, required measurements can be taken if not harmed by the offset differences, or if differences therebetween are small or insignificant for the specific measurements.

In some embodiments, required actions such as taking measurements can relate to a layer that is lower than the top layer, and can be done only if upper layers are ignored, which is enabled by layer-wise matching followed by ignoring features in upper layers.

In some embodiments, a preliminary global registration can be performed, in order to save processing time for the layer-wise matching by limiting the offset to a particular range.

Alternatively, the first offset can be used as a guideline for the following matching, by providing a rough offset.

The initial registration or first matching can be used for eliminating possible incorrect registrations or matchings caused by repetitive patterns, for example when the fabricated object comprises a plurality of identical components. In such embodiments, the initial or first registration can provide a plurality of possible offsets, one of which is selected to continue with.

Given an object description comprising a plurality of layers, it can be required to determine the order at which the layers are matched with an image of an object fabricated in accordance with the design. It will be appreciated that the matching order is not necessarily the order at which the layers are to be placed during fabrication of the object. Rather, the order should be determined such that each additional matching provides as much information as possible and does not harm matching of other layers.

For example, thin features comprised within thicker features can have to be matched prior to matching the thicker ones, since otherwise the thin features can be masked and cannot be identified. On the other hand, thin features can be erroneously detected in more locations, while thicker features have higher chance of being located correctly. Thus, optimization can be required in order to determine a layer order that maximizes the information utilization. Optimization of the layer order may also take into account whether pixels of one layer are masked when matching further layers or not.

In some embodiments, at a setup stage, an object can be received, for example a prototype or one of the first objects to be fabricated, upon which a multiplicity of multi-layer matchings can be performed, each with a different layer order. The results, for example the accuracy obtained by each multi-layer matching and the time it consumed can be compared, and the layer order which is most cost-effective may be selected for further registrations. It will be appreciated that not all layer permutations are necessarily tried and one or more can be eliminated by a user, thus making the layer order determination stage shorter.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined in and by the appended claims.

What is claimed is:

1. An apparatus for registering between an image of a multi-layer object and a description of the multi-layer object, the apparatus comprising:
   a memory for storing an image of the multi-layer object and at least part of the description of the multi-layer object, the at least part comprising a first description of at least a first layer and a second description of at least a second layer of at least two layers of the multi-layer object; and
   a processor operatively connected to the memory for:
      matching the first description to at least a first part of the image by determining first pixels of the image in which a first feature from the first description of the first layer is found, the first part informative of at least a part of the first layer, thereby determining at least one first matching offset;

matching the second description to at least a second part of the image, which at least partially overlaps with the first image, by disregarding the first pixels in the first part of the image, the second part informative of at least a part of the second layer, thereby determining at least one second matching offset; and registering between the image of the multi-layer object and the description of the multi-layer object based on the at least one first matching offset and the at least one second matching offset.

2. The apparatus of claim 1, wherein the description of the multi-layer object is a Computer Aided Design (CAD) of the multi-layer object.

3. The apparatus of claim 1, wherein the description of a given layer is an image selected from one or more of an image presenting the given layer of a reference object, and a synthetic image presenting the given layer and synthesized upon the design of the multi-layer object.

4. The apparatus of claim 3, wherein the synthetic image is an image comprising at least one layer that has not been captured by an examination tool.

5. The apparatus of claim 1, wherein disregarding the first pixels comprises one of assigning a neutral value to the first pixels and ignoring the first pixels.

6. The apparatus of claim 1, wherein the processor is further configured to:
   match a description of each further layer of the multi-layer object with at least a part of the image informative of at least a part of the further layer to determine at least one further matching offset; and
   register between the image of the multi-layer object and the description of the multi-layer object based on the at least one first matching offset, the at least one second matching offset and the at least one further matching offset.

7. The apparatus of claim 1, wherein the processor is further configured to combine the at least one first matching offset and the at least one second matching offset into a single offset usable for registration.

8. The apparatus of claim 1, wherein the processor is further configured to notify a user that the at least one first matching offset and the at least one second matching offset cannot be combined into a single offset usable for registration.

9. The apparatus of claim 1, wherein registration includes determining a location of one or more features from the description within the image.

10. The method of claim 1, further comprising:
    responsive to disregarding the first pixels, performing a virtual completion of a second feature associated with the second layer.

11. A method for registering between an image of a multi-layer object and a description of the multi-layer object, the method comprising:
    receiving the image of the multi-layer object and at least part of the description of the multi-layer object, the at least part comprising a first description of at least a first layer of at least two layers of the multi-layer object and a second description of at least a second layer of the multi-layer object;
    matching, by a processor, the first description to at least a first part of the image by determining first pixels of the image in which a first feature from the first description of the first layer is found, to determine at least one first matching offset, wherein the first part is informative of at least a part of the first layer;
    matching, by the processor, the second description to at least a second part of the image, which at least partially overlaps with the first image, by disregarding the first pixels in the first part of the image, to determine at least one second matching offset between the second description of the second layer and the second part of the image, wherein the second part is informative of at least a part of the second layer; and
    registering between the image of the multi-layer object and the description of the multi-layer object based on the at least one first matching offset and the at least one second matching offset.

12. The method of claim 11, wherein the description of the multi-layer object is a Computer Aided Design (CAD) of the multi-layer object.

13. The method of claim 11, further compromising combining the at least one first matching offset and the at least one second matching offset into a single matching offset usable for registration.

14. The method of claim 11, wherein the description of a given layer is a visual representation selected from: an image presenting the given layer of a reference object; and a synthetic image synthesized upon the design of the multi-layer object.

15. The method of claim 11, wherein disregarding the first pixels comprises one of assigning a neutral value to the first pixels, and ignoring the first pixels.

16. The method of claim 11, wherein the first feature is a polygon, and wherein subject to the polygon being an open polygon, the polygon is closed by edges of the captured image.

17. The method of claim 11, wherein the at least part of the description of the multi-layer object comprises a further description of a further layer of the multi-layer object, the method further comprising:
    matching, by the processor, the further description to at least a part of the image informative of at least a part of the further layer, thereby determining at least one further matching offset; and
    registering between the image of the multi-layer object and the description of the multi-layer object based on the at least one first matching offset, the at least one second matching offset and the at least one further matching offset.

18. The method of claim 17, wherein matching the further description comprises:
    determining the first pixels in the first part of the image in which the first feature from the first description is found;
    determining second pixels in the second part of the image in which a second feature from the second description is found; and
    masking the first pixels and the second pixels.

19. A non-transitory computer readable storage medium comprising instructions, which when executed by a processor, cause the processor to perform operations comprising:
    receiving the image of a multi-layer object and at least part of the description of the multi-layer object, the at least part comprising a first description of at least a first layer of at least two layers of the multi-layer object and a second description of at least a second layer of the multi-layer object;
    matching the first description to at least a first part of the image by determining first pixels of the image in which a first feature from the first description of the first layer is found, to determine at least one first matching offset, wherein the first part is informative of at least a part of the first layer;

matching the second description to at least a second part of the image, which at least partially overlaps with the first image, by disregarding the first pixels in the part of the image, to determine at least one second matching offset between the second description of the second layer and the second part of the image, wherein the second part is informative of at least a part of the second layer; and registering between the image of the multi-layer object and the description of the multi-layer object based on the at least one first matching offset and the at least one second matching offset.

\* \* \* \* \*